US009680773B1

(12) United States Patent
Tan et al.

(10) Patent No.: US 9,680,773 B1
(45) Date of Patent: Jun. 13, 2017

(54) INTEGRATED CIRCUIT WITH DYNAMICALLY-ADJUSTABLE BUFFER SPACE FOR SERIAL INTERFACE

(75) Inventors: Zun Yang Tan, Kuantan (MY); Tat Mun Lui, Petaling Jaya (MY); Boon Jin Ang, Butterworth (MY); Chiang Wei Lee, Pulau Penang (MY); Richard Jin Guan Saw, Ipoh (MY); Want Sent Khor, Kajang (MY)

(73) Assignee: Altera Corporation, San Jose, CA (US)

( * ) Notice: Subject to any disclaimer, the term of this patent is extended or adjusted under 35 U.S.C. 154(b) by 579 days.

(21) Appl. No.: 13/245,790

(22) Filed: Sep. 26, 2011

(51) Int. Cl.
| | | |
|---|---|---|
| *H04L 12/861* | (2013.01) |
| *G06F 5/12* | (2006.01) |
| *G06F 1/32* | (2006.01) |
| *G11C 5/14* | (2006.01) |

(52) U.S. Cl.
CPC ............ *H04L 49/9005* (2013.01); *G06F 5/12* (2013.01); *G06F 1/3225* (2013.01); *G06F 1/3243* (2013.01); *G06F 1/3278* (2013.01); *G06F 1/3287* (2013.01); *G11C 5/148* (2013.01)

(58) Field of Classification Search
CPC . H04L 49/9005; G06F 1/3225; G06F 1/3243; G06F 1/3278; G06F 1/3287; G06F 5/12; G11C 5/148
See application file for complete search history.

(56) References Cited

U.S. PATENT DOCUMENTS

| | | | | |
|---|---|---|---|---|
| 5,515,329 A * | 5/1996 | Dalton et al. | ............... | 365/221 |
| 5,581,736 A * | 12/1996 | Smith | ............... | 711/170 |
| 5,867,663 A * | 2/1999 | McClure et al. | ............. | 709/234 |
| 6,094,695 A * | 7/2000 | Kornher | ............... | 710/56 |
| 6,385,672 B1 * | 5/2002 | Wang et al. | ............... | 710/56 |
| 6,401,147 B1 * | 6/2002 | Sang et al. | ............... | 710/56 |
| 6,987,775 B1 * | 1/2006 | Haywood | ............... | 370/429 |
| 7,051,306 B2 * | 5/2006 | Hoberman | ............ | G06F 1/3203 716/127 |
| 7,337,026 B2 | 2/2008 | Lin | | |
| 7,395,385 B2 * | 7/2008 | Cobley | ............... | 711/158 |
| 7,535,254 B1 * | 5/2009 | Case | ............... | H03K 19/17732 326/39 |
| 7,761,620 B2 * | 7/2010 | Iwata | ............... | 710/52 |
| 7,764,614 B2 | 7/2010 | Wang | | |
| 7,945,716 B2 * | 5/2011 | Wang et al. | ............... | 710/56 |
| 8,019,950 B1 * | 9/2011 | Warshofsky et al. | ......... | 711/154 |
| 8,046,597 B2 * | 10/2011 | Dawkins | ............... | G06F 1/3221 713/300 |
| 2005/0209718 A1 | 9/2005 | Lin | | |
| 2007/0110086 A1 | 5/2007 | Wang | | |
| 2007/0112995 A1 * | 5/2007 | Manula | ............... | G06F 13/423 710/310 |
| 2011/0302356 A1 * | 12/2011 | Helton | ............... | 711/103 |
| 2011/0320651 A1 * | 12/2011 | Poublan et al. | ............... | 710/53 |

* cited by examiner

*Primary Examiner* — Eric Oberly
(74) *Attorney, Agent, or Firm* — Okamoto & Benedicto LLP (57) ABSTRACT

One embodiment relates to an integrated circuit which includes a method of dynamically adjusting a receive buffer in an integrated circuit. A fixed-size buffer circuit of the receive buffer is used to buffer data received by way of a serial interface circuit. The performance of the serial interface circuit are monitored. The receive buffer is dynamically extended based on said performance. Other embodiments, aspects, and features are also disclosed.

14 Claims, 7 Drawing Sheets

FIG. 7

INTEGRATED CIRCUIT WITH DYNAMICALLY-ADJUSTABLE BUFFER SPACE FOR SERIAL INTERFACE

BACKGROUND

Technical Field

The present invention relates generally to serial interfaces for integrated circuits.

Description of the Background Art

Serial interfaces are used to communicate data between devices in a system. Serial interface protocols have been developed at increasingly fast data rates. Examples of industry-standard protocols for serial interfaces include PCI Express® (Peripheral Component Interconnect Express), XAUI (X Attachment Unit Interface), sRIO (serial Rapid IO), and many others.

SUMMARY

One embodiment relates to an integrated circuit which includes a method of dynamically adjusting a receive buffer in an integrated circuit. A fixed-size buffer circuit of the receive buffer is used to buffer data received by way of a serial interface circuit. The performance of the serial interface circuit is monitored. The receive buffer is dynamically extended based on said performance.

Other embodiments, aspects and features are also disclosed.

DETAILED DESCRIPTION

In order to achieve high performance in a serial receiver on an integrated circuit, a typical system will provide a receive buffer formed using a standard cell or a structured array cell within the confines of "hard" logic circuitry. The size of this "hard" buffer is generally determined up-front in the design phase.

Applicants have determined that such a buffer is disadvantageous in that it cannot be re-sized after the design is fabricated and used in an actual system. In order to overcome this disadvantage, the present disclosure provides a dynamically-adjustable buffer space for an integrated circuit.

Figure 1:
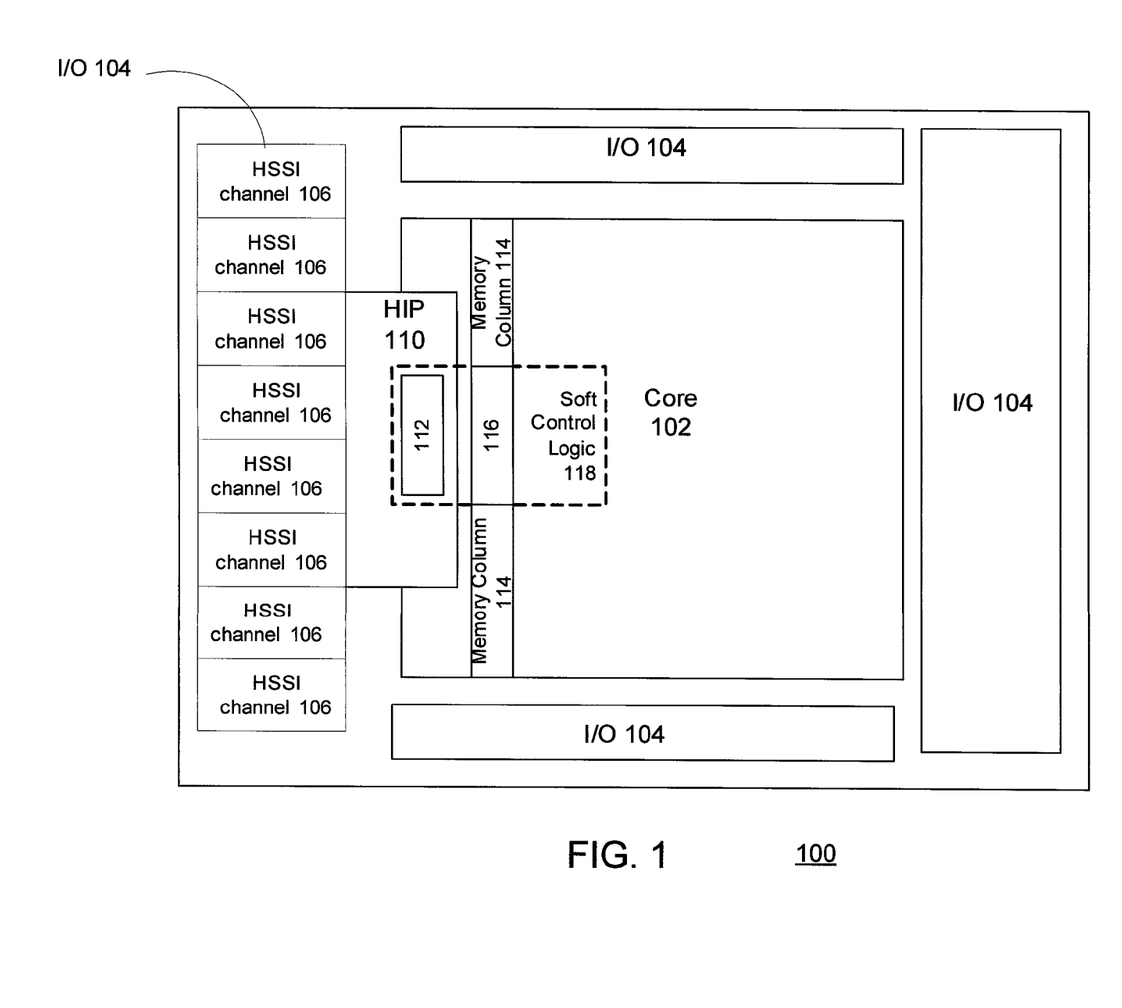
FIG. 1 depicts an example layout of a first integrated circuit with a dynamically-adjustable buffer space for a serial interface in accordance with an embodiment of the invention.

FIG. 1 depicts an example layout of a first integrated circuit 100 with a dynamically-adjustable buffer space for a serial interface in accordance with an embodiment of the invention. In this example, the integrated circuit 100 includes a core circuit region 102 and input/output (I/O) circuit arrays 104.

The core circuit region 102 may comprise, for example, a programmable (configurable) array of circuit blocks and interconnects. The core circuit region 102 may be, for example, the core fabric of a programmable logic device (PLD), such as a complex PLD or a field programmable gate array (FPGA). Note that the specific circuitry in the core circuit region 502 will vary, and the present invention is not intended to be limited to a specific implementation or layout of a core circuit region 102.

As further shown, an I/O circuit array 104 may include an array of high-speed serial interface (HSSI) channel circuits 106. An HSSI channel circuit 106 may include, for example, a physical coding sublayer (PCS) channel circuit and a physical media access (PMA) channel circuit.

The PCS channel circuit generally provides digital logic functions which implement data communication protocols (or portions thereof), while the PMA channel circuit generally provides mixed (analog/digital) signal functionality for the data communications. For example, a PMA channel circuit may be configured to perform, among other operations, serialization of data to be transmitted (conversion from parallel to serial) and de-serialization of received data (conversion from serial to parallel). For certain protocols, a PCS channel circuit may be configured to perform, among other functions, 64-bit to 66-bit encoding for data to be sent to the PMA channel circuit and 66-bit to 64-bit decoding for data received from the PMA channel circuit. A PCS channel may also perform phase compensation using FIFO (first-in first-out) buffers.

As shown, the integrated circuit 100 may include a "hard intellectual property" (HIP) circuitry 110. The HIP circuitry 110 may be "hard-wired" in that the circuitry is formed during the fabrication of the integrated circuit 100 and is not configured by subsequent programming. The HIP circuitry 110 may include, for example, digital circuitry designed to implement communications protocols used by the HSSI channel circuits 106. A high-performance buffer circuit 112 may be formed in the HIP circuits 110. The high-performance buffer 112 may be used to buffer data received by one or more of the HSSI channel circuits 106. The integrated circuit 100 may also include a memory column 114 of programmable memory blocks within the core circuit region 102.

In accordance with this embodiment of the invention, the integrated circuit 100 may include an extensible-range low-performance buffer 116 formed in the memory column 114 and "soft" (programmable) control logic 118 formed in the core circuit region 102. The operation of the extensible-range low-performance buffer 116 and the soft control logic 118 is described further below in relation to FIG. 2.

Figure 2:
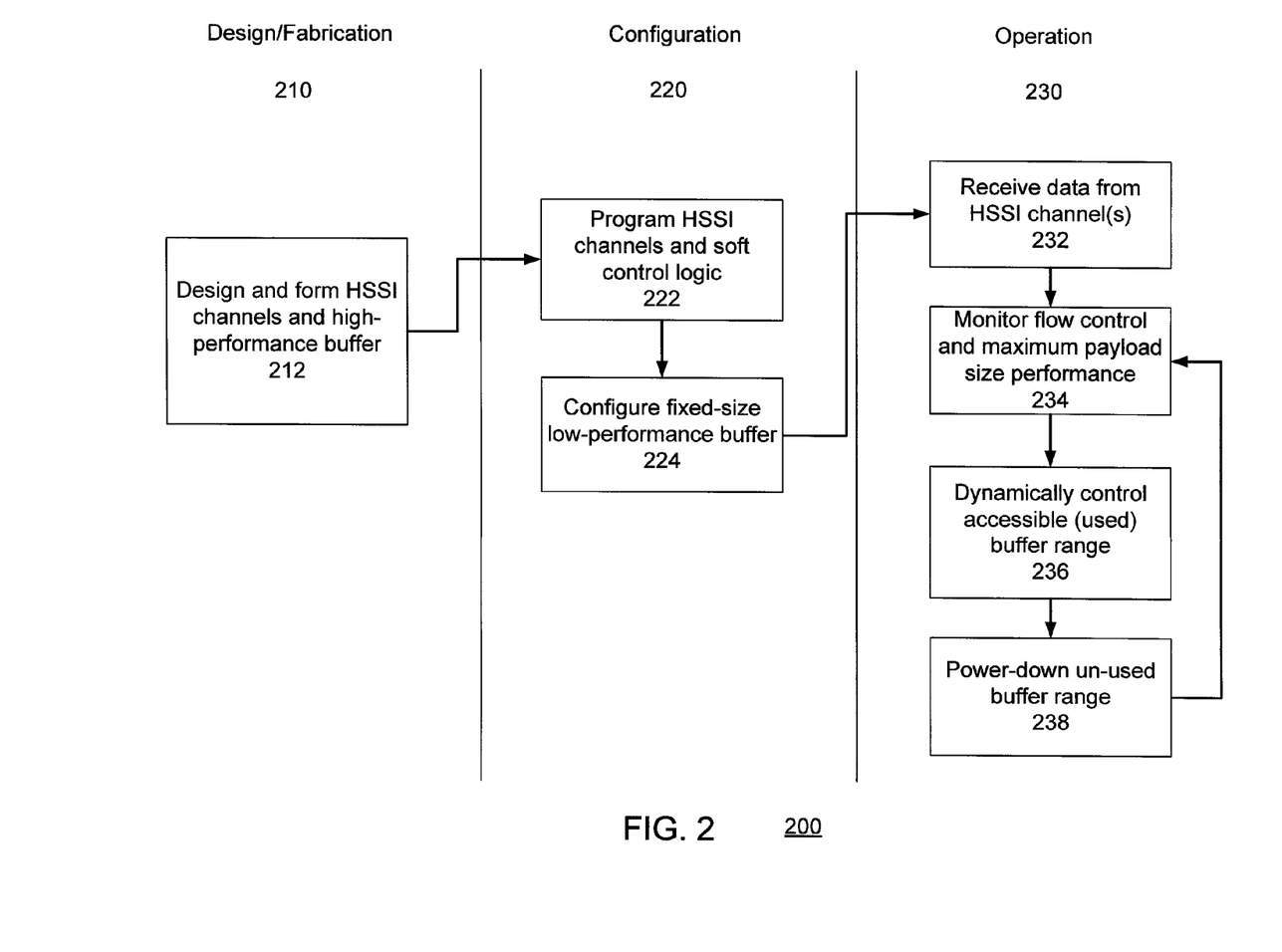
FIG. 2 is a schematic diagram of a first method for providing a dynamically-adjustable buffer space for a serial interface in accordance with an embodiment of the invention.

FIG. 2 is a schematic diagram of a first method 200 for providing a dynamically-adjustable buffer space for a serial interface in accordance with an embodiment of the invention. The method 200 of FIG. 2 may be implemented, for example, with the integrated circuit 100 of FIG. 1.

As shown in FIG. 2, the HSSI channel circuits 106, the HIP circuitry 110, and the high-performance buffer 112, among other circuits, may be designed and formed 212 in "hard" or "hard-wired" (i.e. non-programmable) circuitry. The hard circuitry is formed in a permanent manner by way of the computer-aided design and fabrication 210 of the integrated circuit 100. The hard circuitry is permanent in that it is not subsequently configured during a configuration (programming) 220 of the integrated circuit 100.

During the configuration (programming) 220 of the integrated circuit 100, the HSSI channels 106 and the soft control logic 118 are programmed 222, and the fixed-size low-performance buffer 116 is configured 224 (not necessarily in that order). The HSSI channels 106 may be programmed, for example, to utilize select HIP circuitry 110 to implement a particular serial interface protocol. As described above, the fixed-size low-performance buffer 116 may be configured within a memory column 114 on a same side of the integrated circuit 100 as the high-speed buffer 112. As described further below, the soft control logic 118 may be programmed 222 to dynamically control the accessible range of the low-performance buffer 116 as the serial data is received during the operation 230 of the integrated circuit 100.

During the operation 230 of the integrated circuit 100 in a system, serial data may be received 232 by the high-speed buffer 112 from one or more of the HSSI channel circuits, and the performance of the buffering may be monitored 232. In particular, the flow control and maximum payload performance of the buffer may be monitored 234 (for example, by monitoring circuitry in the HIP circuitry 110).

Based on the monitored performance of the buffering, the soft control logic 118 dynamically controls 236 the accessible (i.e. used) range in the low-performance buffer 116. The soft control logic 118 may also dynamically power-down 238 the un-used circuitry in the low-performance buffer 116. This advantageously conserves power consumed by the integrated circuit 100 with minimal performance impact.

Figure 3:
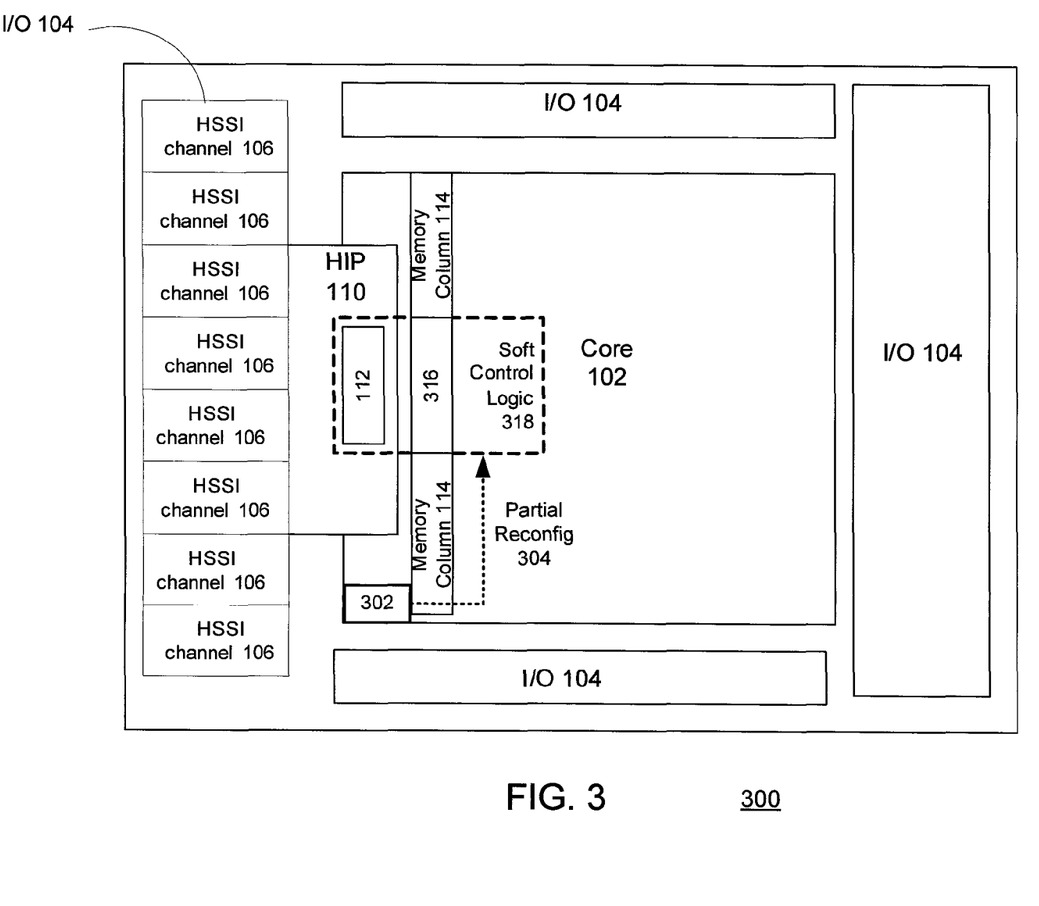
FIG. 3 depicts an example layout of a second integrated circuit with a dynamically-adjustable buffer space for a serial interface in accordance with an embodiment of the invention.

FIG. 3 depicts an example layout of a second integrated circuit 300 with a dynamically-adjustable buffer space for a serial interface in accordance with an embodiment of the invention. Similar to the integrated circuit 100 of FIG. 1, the integrated circuit 300 of FIG. 3 includes a core circuit region 102 and input/output (I/O) circuit arrays 104.

The core circuit region 102 may comprise, for example, a programmable (configurable) array of circuit blocks and interconnects. The core circuit region 102 may be, for example, the core fabric of a programmable logic device (PLD), such as a complex PLD or a field programmable gate array (FPGA). Note that the specific circuitry in the core circuit region 102 will vary, and the present invention is not intended to be limited to a specific implementation or layout of a core circuit region 102.

As further shown, an I/O circuit array 104 may include an array of high-speed serial interface (HSSI) channel circuits 106. As described above, an HSSI channel circuit 106 may include, for example, a PCS channel circuit and a PMA channel circuit.

Also similar to the integrated circuit 100 of FIG. 1, the integrated circuit 300 of FIG. 3 may include HIP circuitry 110 to implement communications protocols. A high-performance buffer circuit 112 formed in the HIP circuitry 110 may be used to buffer data received by one or more of the HSSI channel circuits 106. The integrated circuit 300 may also include a memory column 114 of programmable memory blocks within the core circuit region 102.

The integrated circuit 300 includes a control block 302 which may be configured in "soft" (programmable) logic. (In an alternate embodiment, the control block may be implemented in "hard" logic.) In accordance with an embodiment of the invention, the control block 302 may be configured to utilize a partial reconfiguration 304 capability during operation of the integrated circuit 300. In particular, the control block 302 may use partial reconfiguration 304 to dynamically instantiate an appropriately-sized low-performance buffer 316 and associated "soft" (programmable) control logic 318. For example, the low-performance buffer 316 may be instantiated within the memory column 114, and the soft control logic 318 may be instantiated within the core region 102. The operation of the integrated circuit 300 of FIG. 3 is described further below in relation to FIG. 4.

Figure 4:
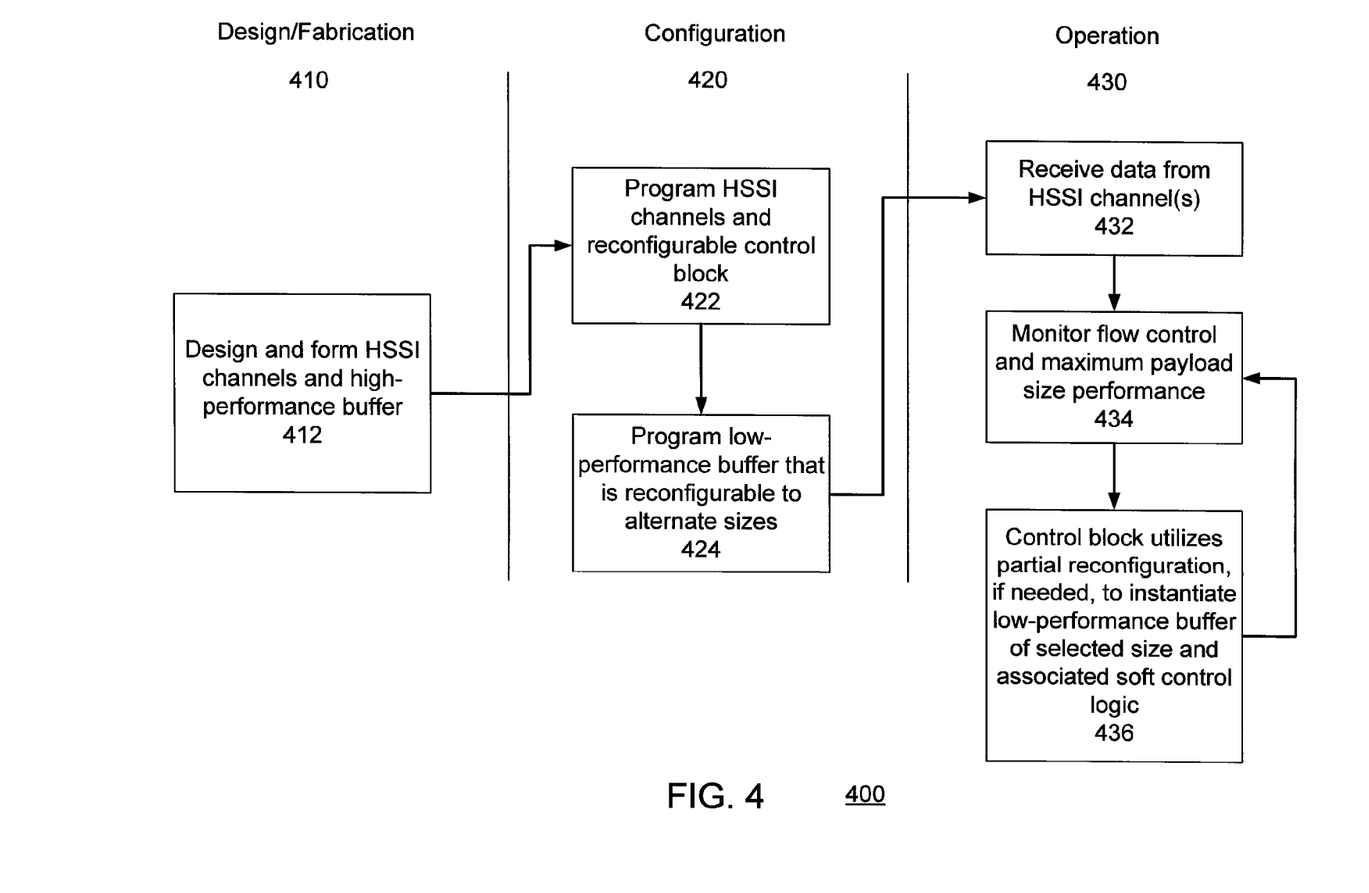
FIG. 4 is a schematic diagram of a second method for providing a dynamically-adjustable buffer space for a serial interface in accordance with an embodiment of the invention.

FIG. 4 is a schematic diagram of a method 400 for providing a dynamically-adjustable buffer space for a serial interface in accordance with a second embodiment of the invention. The method 400 of FIG. 4 may be implemented, for example, with the integrated circuit 300 of FIG. 3.

As shown in FIG. 4, the HSSI channel circuits 106, the HIP circuitry 110, and the high-performance buffer 112, among other circuits, may be designed and formed 412 in "hard" or "hard-wired" (i.e. non-programmable) circuitry. The hard circuitry is formed in a permanent manner by way of the computer-aided design and fabrication 410 of the integrated circuit 300. The hard circuitry is permanent in that it is not subsequently configured during a configuration (programming) 420 of the integrated circuit 300.

During the configuration (programming) 420 of the integrated circuit 300, the HSSI channels 106 and the control block 302 may be programmed 422. In addition, a low-performance buffer 316 that is reconfigurable to alternate sizes may be programmed 424. (Note that steps 422 and 424 need not be performed in the order shown.) The HSSI channels 106 may be programmed, for example, to utilize select HIP circuitry 110 to implement a particular serial interface protocol. As described above, the low-performance buffer 316 may be configured within a memory column 114 on a same side of the integrated circuit 100 as the high-speed buffer 112. As described further below, the control block 302 may be programmed 222 to use partial reconfiguration 304, if needed, to dynamically instantiate a low-performance buffer 316 of a selected size and associated soft control logic 318 as the serial data is received during the operation 430 of the integrated circuit 300.

During the operation 430 of the integrated circuit 300 in a system, serial data may be received 432 by the high-speed buffer 112 from one or more of the HSSI channel circuits, and the performance of the buffering may be monitored 432. In particular, the flow control and maximum payload performance of the buffer may be monitored 434 (for example, by monitoring circuitry in the HIP circuitry 110).

Based on the monitored performance of the buffering, the control block 302 may use partial reconfiguration 304 to dynamically instantiate 436 a low-performance buffer 316 of an appropriate size and associated soft control logic 318. This advantageously conserves power consumed by the integrated circuit 300 with minimal performance impact.

Figure 5:
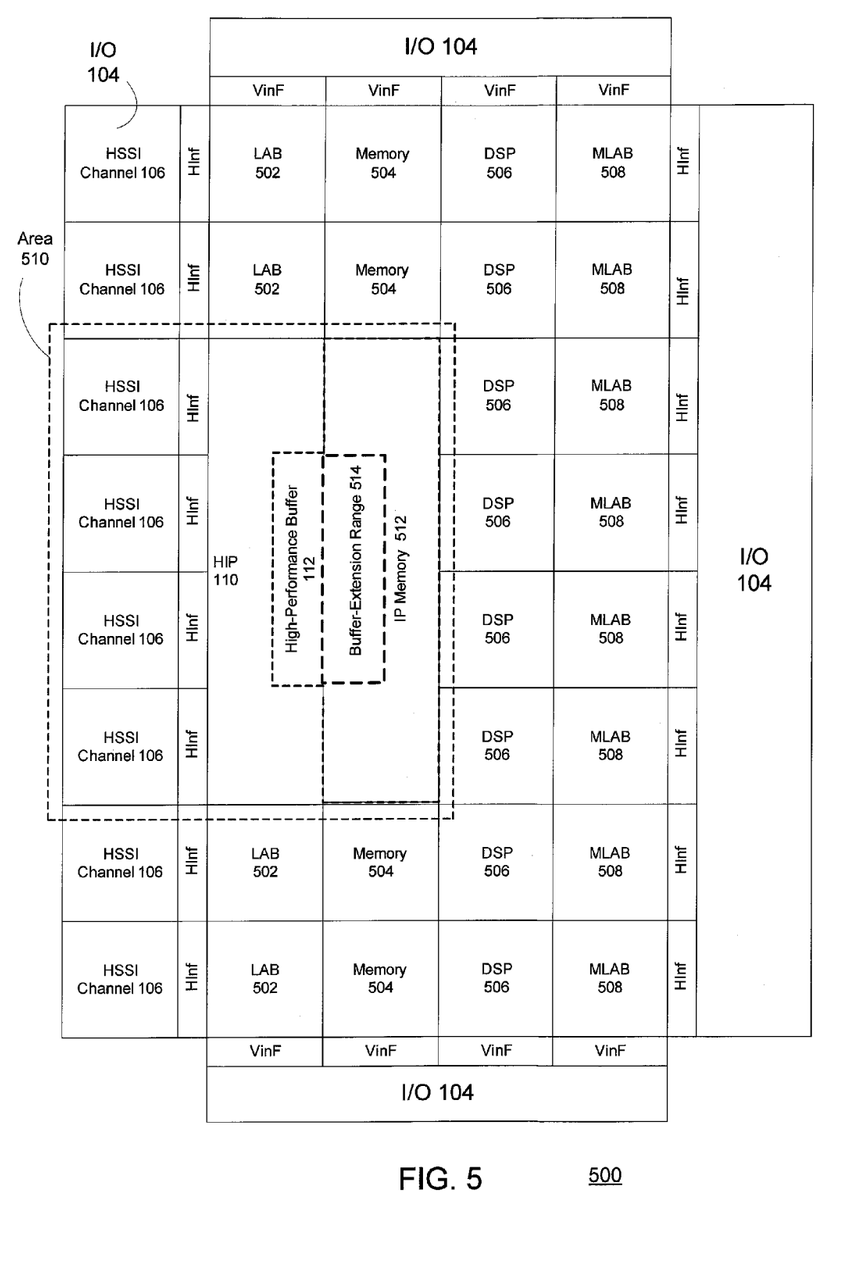
FIG. 5 depicts an example layout of a third integrated circuit with a dynamically-adjustable buffer space for a serial interface in accordance with an embodiment of the invention.

FIG. 5 depicts an example layout of an integrated circuit 500 with a dynamically-adjustable buffer space for a serial interface in accordance with a third embodiment of the invention. Similar to the integrated circuit 100 of FIG. 1, the integrated circuit 500 of FIG. 5 includes a core circuit region (including a programmable array of circuit blocks and interconnects) and input/output (I/O) circuit arrays 104 (which provide the capability to communicate to other devices). Horizontal and vertical interfaces (Hinf and Vinf, respectively) may be arranged between the core circuit region in a central region of the integrated circuit 500 and the I/O circuit arrays 104 on the edges of the integrated circuit 500.

In this illustrative example, the core circuit region is shown to include logic array blocks (LABs) 502, memory blocks 504, digital signal processing (DSP) blocks 506, and memory logic array blocks (MLABs) 508. Note that the specific circuitry in the core circuit region will vary, and the present invention is not intended to be limited to a specific implementation or layout of a core circuit region.

As further shown, at least one I/O circuit array 104 may include an array of high-speed serial interface (HSSI) channel circuits 106. As described above, an HSSI channel circuit 106 may include, for example, a PCS channel circuit and a PMA channel circuit. Similar to FIG. 1, HIP circuitry 110 is included to implement communications protocols. A high-performance buffer circuit 112 formed in the HIP circuitry 110 may be used to buffer data received by one or more of the HSSI channel circuits 106.

In accordance with an embodiment of the invention, a bounded area 510 of the integrated circuit 500 includes the HIP circuitry 110, select HSSI channels 106 being used by the HIP circuitry 110, the high-performance buffer 112 being used for data received via the HSSI channels 106, IP memory 512, and a buffer-extension range 514 within the IP memory 512. The IP memory 512 may include memory blocks (typically, higher-speed memory blocks) which are accessible to (i.e. used by) the HIP circuitry 110. The IP memory 512 may utilize structured gate array technology and may be located adjacent to the high-performance buffer 112. As described further below in relation to the method 600 FIG. 6, the buffer-extension range 514 is a range within the IP memory 512 which is allocated to be used, if needed, to effectively extend the high-performance buffer 112.

Figure 6:
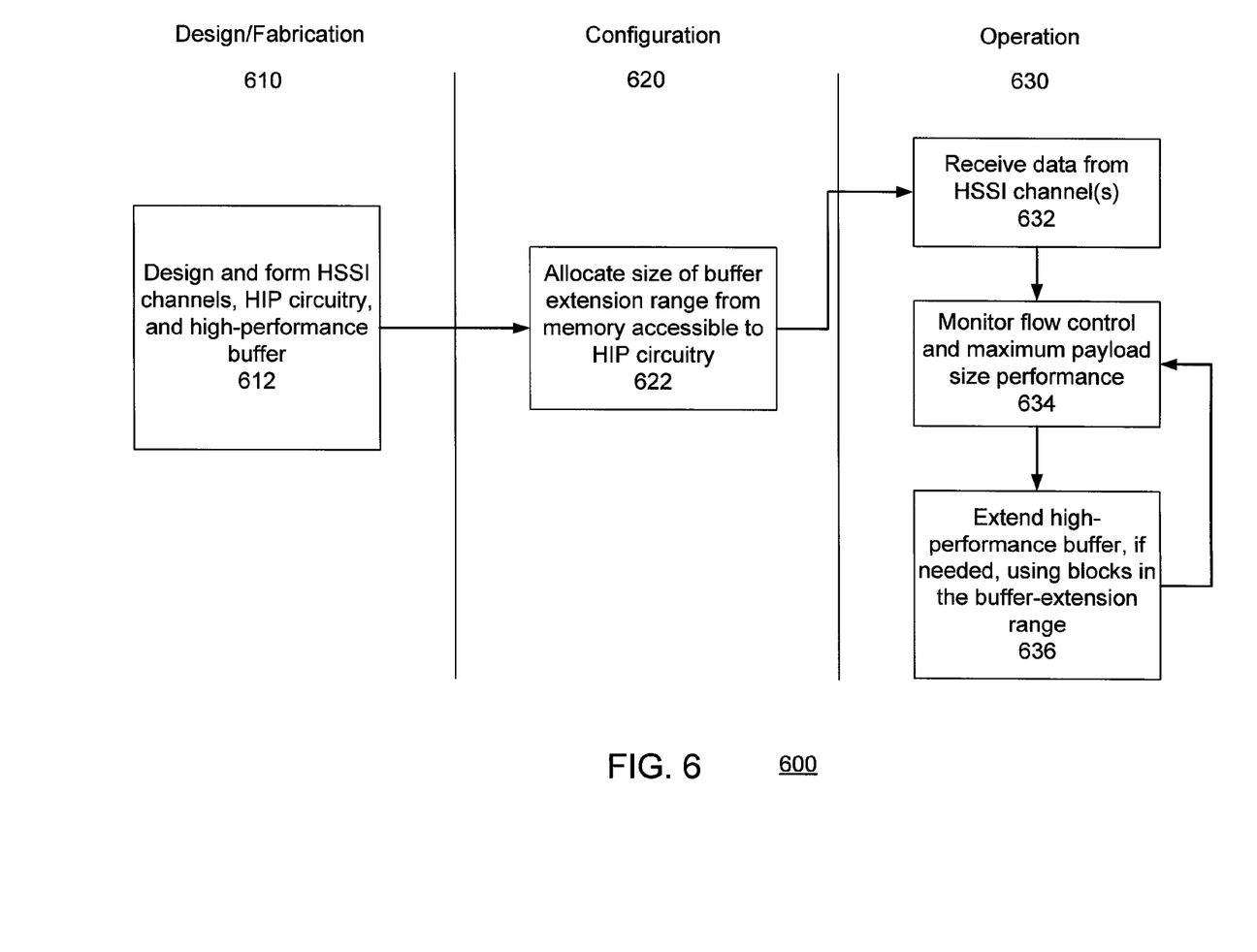
FIG. 6 is a schematic diagram of a third method for providing a dynamically-adjustable buffer space for a serial interface in accordance with an embodiment of the invention.

FIG. 6 is a schematic diagram of a method for providing a dynamically-adjustable buffer space for a serial interface in accordance with a third embodiment of the invention. The method 600 of FIG. 6 may be implemented, for example, with the integrated circuit 500 of FIG. 5.

As shown in FIG. 6, the HSSI channel circuits 106, the HIP circuitry 110, and the high-performance buffer 112, among other circuits, may be designed and formed 612 in "hard" or "hard-wired" (i.e. non-programmable) circuitry. The hard circuitry is formed in a permanent manner by way of the computer-aided design and fabrication 610 of the integrated circuit 500. The hard circuitry is permanent in that it is not subsequently configured during a configuration (programming) 620 of the integrated circuit 500.

During the configuration (programming) 620 of the integrated circuit 500, the size of the buffer-extension range 514 may be allocated 622 from the IP memory 512. The buffer-extension range 514 may include, for example, select blocks of the IP memory 512 which are located adjacent to the high-performance buffer 112 and which are not necessarily needed by the communications protocol being used.

During the operation 630 of the integrated circuit 500 in a system, serial data may be received 632 by the high-speed buffer 112 from one or more of the HSSI channel circuits, and the performance of the buffering may be monitored 634 (for example, by monitoring circuitry in the HIP circuitry 110). In particular, the flow control and maximum payload performance of the buffering may be monitored.

Based on the monitored performance of the buffering, the high-performance buffer 112 may be dynamically extended 636 using one or more memory blocks from the buffer-extension range 514. For example, in order to meet new performance requirements of HIP circuitry 110 implementing PCI Express® (or another high-speed protocol), the size of the "hard" high-performance buffer 112 may be effectively extended using one or more 10 kilobyte (or other size) buffers available in the buffer-extension range 514.

Figure 7:
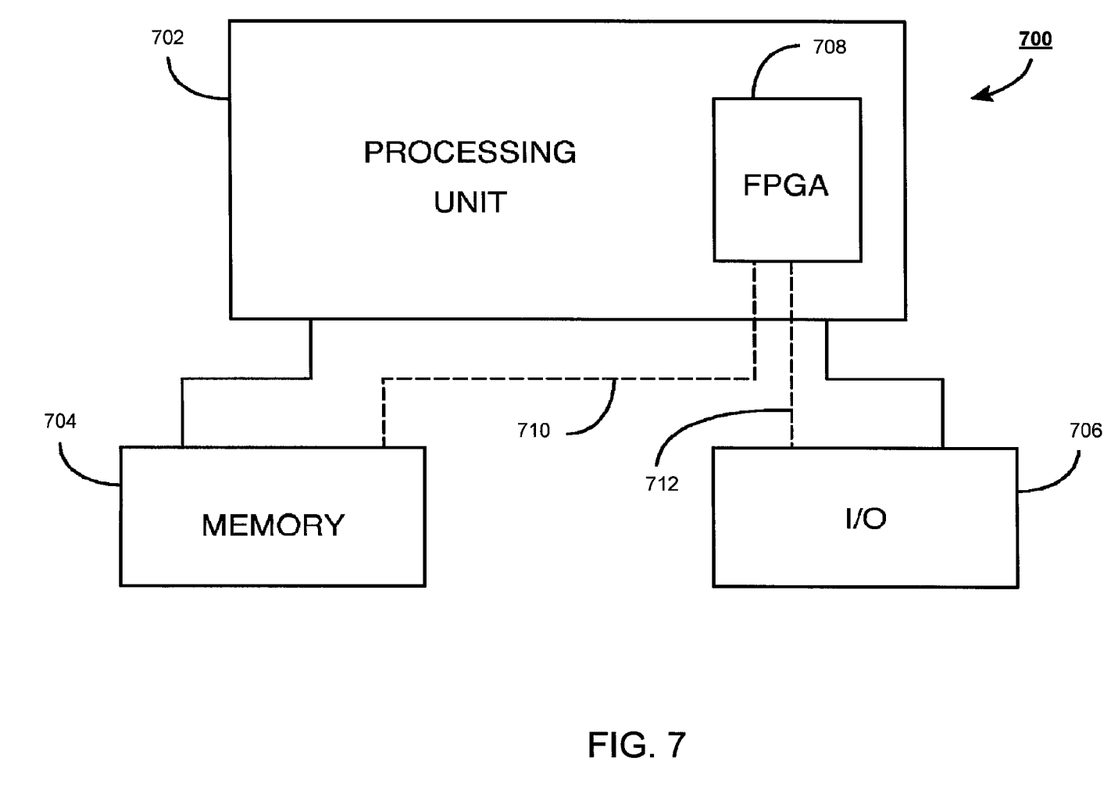
FIG. 7 is a block diagram of an exemplary digital system that can employ techniques of the present invention.

The present invention can also be implemented in a system that has an integrated circuit, such as an FPGA, as one of several components. FIG. 7 shows a block diagram of an exemplary digital system 700 that can embody techniques of the present invention. System 700 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 may be provided on a single board, on multiple boards, or within multiple enclosures.

System 700 includes a processing unit 702, a memory unit 704, and an input/output (I/O) unit 706 interconnected together by one or more buses. According to this exemplary embodiment, FPGA 708 is embedded in processing unit 702. FPGA 708 can serve many different purposes within the system 700. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 may direct data to an appropriate system component for processing or storage, execute a program stored in memory 704, receive and transmit data via I/O unit 706, or other similar function. Processing unit 702 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 may control the logical operations of the system. As another example, FPGA 708 acts as a reconfigurable processor that may be reprogrammed as needed to handle a particular computing task. Alternately, FPGA 708 may itself include an embedded microprocessor. Memory unit 704 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A method of dynamically adjusting a receive buffer in an integrated circuit chip, the method comprising:
using a first non-programmable buffer circuit of fixed size of the receive buffer to buffer data received by way of a serial interface circuit, wherein the serial interface circuit and the first non-programmable buffer circuit are in the integrated circuit chip;
monitoring performance of the serial interface circuit using monitoring circuitry in the integrated circuit chip; and
dynamically extending the receive buffer based on said performance during operation of the integrated circuit chip by a control circuit which uses partial reconfiguration as the serial data is received during operation of the integrated circuit chip to instantiate a second buffer circuit in programmable memory blocks and to instantiate associated control logic in a core of the integrated circuit chip.

2. The method of claim 1, wherein monitoring the performance of the serial interface circuit comprises monitoring a flow control and a maximum payload of the serial interface circuit.

3. The method of claim 1, further comprising:
during operation of the integrated circuit chip, powering-down dynamically an un-used buffer range of the programmable memory blocks of the second buffer circuit by the programmable control logic in the integrated circuit chip.

4. The method of claim 1, wherein alternate sizes for the instantiation of the second buffer circuit are programmed during configuration of the integrated circuit chip.

5. An integrated circuit on a single semiconductor substrate, the integrated circuit comprising:
at least one serial interface circuit;
digital protocol circuitry coupled to the serial interface circuit and arranged to implement a serial communications protocol;
a first buffer circuit arranged to buffer data received from the serial interface circuit, wherein the first buffer circuit is fixed in size during fabrication of the integrated circuit on the single semiconductor substrate;
a control circuit which uses partial reconfiguration during operation to instantiate a second buffer circuit within a memory column and to instantiate a control logic circuit in a core region to dynamically control the second buffer circuit.

6. The integrated circuit of claim 5, further comprising:
monitoring circuitry arranged to monitor performance of the serial interface circuit,
wherein the control logic circuit uses performance signals from the monitoring circuitry to dynamically determine the accessible buffer range in the second buffer circuit.

7. The integrated circuit of claim 6, wherein the monitoring circuitry is arranged to monitor a flow control and a maximum payload of the serial interface circuit.

8. The integrated circuit of claim 5, wherein the control logic circuit is further configured to power-down an un-used buffer range of the memory blocks.

9. The integrated circuit of claim 5, wherein the integrated circuit comprises a programmable logic device.

10. An integrated circuit on a single semiconductor substrate, the integrated circuit comprising:
at least one serial interface circuit;
digital protocol circuitry coupled to the serial interface circuit and arranged to implement a serial communications protocol;
a first non-programmable buffer circuit arranged to buffer data received from the serial interface circuit;
a second programmable memory-based buffer circuit that is reconfigurable to alternate sizes; and
a control circuit which utilizes partial reconfiguration to instantiate the second programmable memory-based buffer circuit of a selected size and an associated control logic as the serial data is received during operation of the integrated circuit.

11. The integrated circuit of claim 10, wherein the first buffer circuit is fixed in size during fabrication of the integrated circuit, and wherein alternate sizes for the second buffer circuit are programmed during configuration of the integrated circuit.

12. The integrated circuit of claim 10, further comprising:
monitoring circuitry arranged to monitor performance of the serial interface circuit,
wherein performance signals from the monitoring circuitry are used by the control circuit to dynamically select a size for the second buffer circuit.

13. The integrated circuit of claim 10, wherein the integrated circuit comprises a programmable logic device.

14. The method of claim 1, wherein the second buffer circuit is instantiated in a memory column of programmable memory blocks between the first non-programmable buffer circuit and the core of the integrated circuit chip.

* * * * *